United States Patent [19]

Sanders et al.

[11] Patent Number: 5,028,741
[45] Date of Patent: Jul. 2, 1991

[54] HIGH FREQUENCY, POWER SEMICONDUCTOR DEVICE

[75] Inventors: Paul W. Sanders; Randy Pollock, both of Scottsdale, Ariz.

[73] Assignee: Motorola, Inc., Schaumburg, Ill.

[21] Appl. No.: 528,310

[22] Filed: May 24, 1990

[51] Int. Cl.[5] .................. H01L 23/28; H05K 5/02
[52] U.S. Cl. .................... 174/52.2; 357/70; 357/72; 361/421
[58] Field of Search ............... 174/52.2, 52.4; 361/421; 357/70, 72

[56] References Cited

U.S. PATENT DOCUMENTS

| | | | |
|---|---|---|---|
| 3,689,683 | 9/1972 | Paletto et al. | 174/52.2 |
| 4,507,675 | 3/1985 | Fujii | 357/70 |
| 4,942,454 | 7/1990 | Mori et al. | 357/70 |
| 4,961,105 | 10/1990 | Yamamoto | 357/72 |

FOREIGN PATENT DOCUMENTS 0287046 11/1988 Japan ................... 357/70

*Primary Examiner*—Leo P. Picard
*Assistant Examiner*—Bot L. Ledynh
*Attorney, Agent, or Firm*—Robert M. Handy; Eugene A. Parsons

[57] ABSTRACT

A high frequency, low cost power semiconductor device (60) is provided by combining a semiconductor die (46) with a leadframe (10,12) having a coplanar upper surface (36) with thin external leads (18,20) and a thicker central die bond region (24) whose upper face (16) and sides (42) are covered by an encapsulation (52) but whose lower face (54) is exposed. The leadframe (10,12) desirably has an "H" pattern with the arms (18,20) extending laterally from opposed sides of the encapsulation (52) and down-formed to have their lower surfaces (62) coplanar with the exposed lower face (54) of the central die bond region (16,24) which forms the cross-bar of the "H". The leadframe is monolithic and preferably formed by skiving. The device is especially suited for surface-mounting.

8 Claims, 2 Drawing Sheets

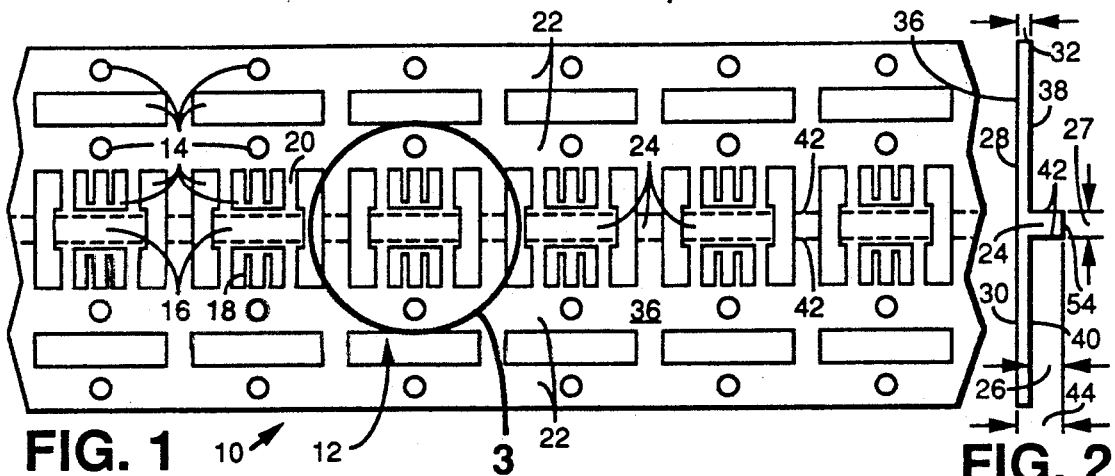
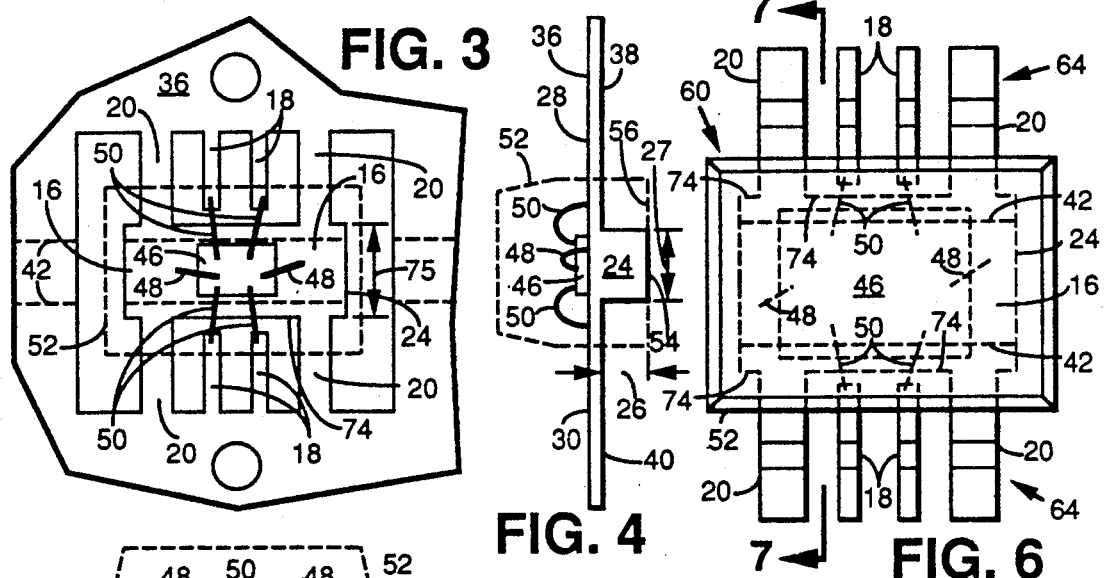
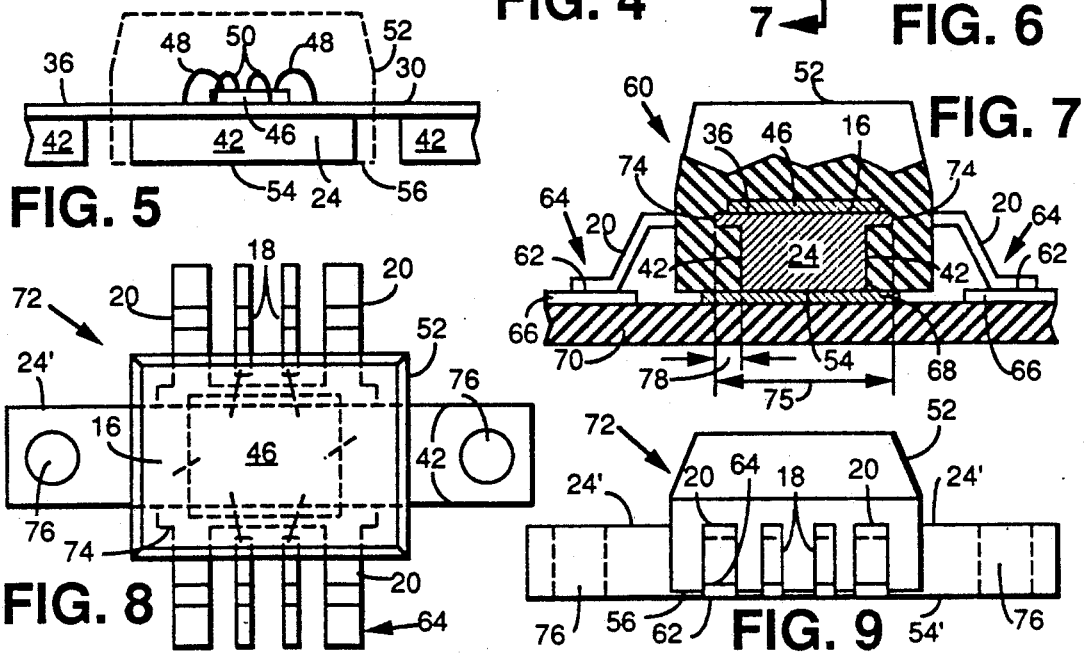

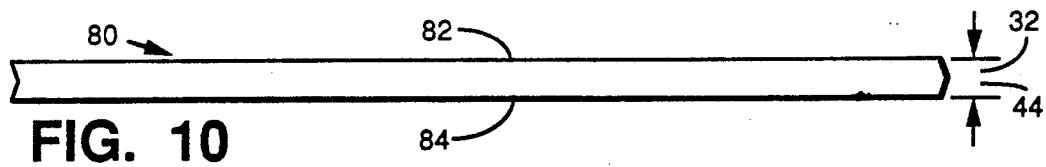
FIG. 10
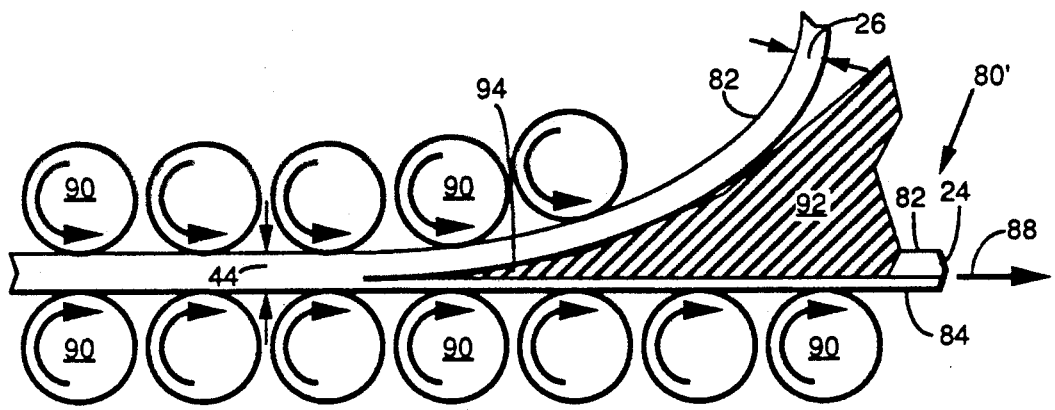
FIG. 11
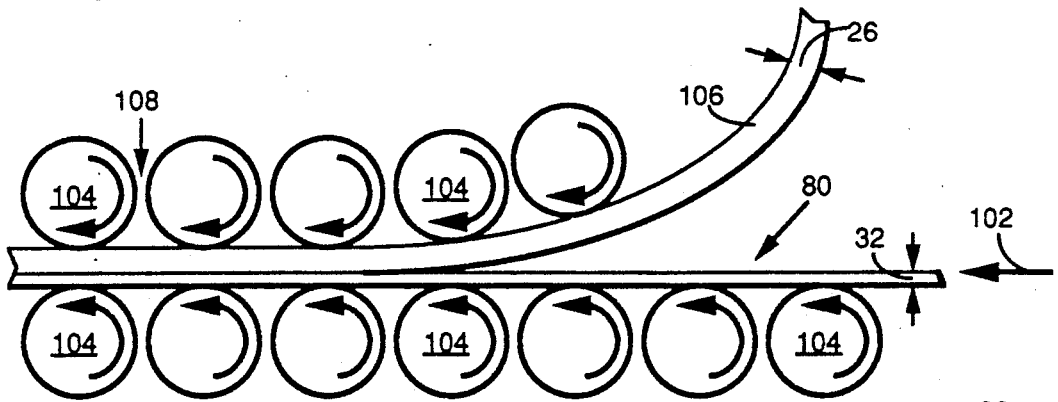
FIG. 12
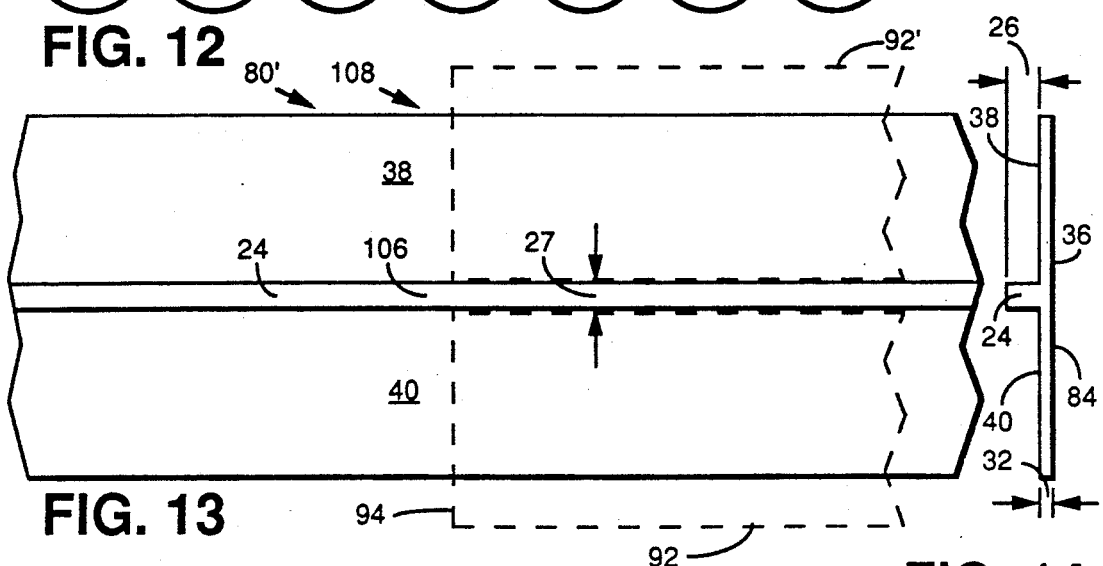
FIG. 13
FIG. 14

HIGH FREQUENCY, POWER SEMICONDUCTOR DEVICE

FIELD OF THE INVENTION

This invention concerns electronic devices and, more particularly improved means and methods for high frequency semiconductor devices of low cost and high power dissipation, suitable for surface mounting.

BACKGROUND ART

There is increasing interest in the electronic arts in devices that are suitable for surface mounting, that is, devices whose leads are coplanar and designed to be soldered to the surface of planar metal pads on a circuit board or the like rather than penetrating through holes in the circuit board. A number of surface mount package designs, as for example types SOT-23, SOT-143 and SO-8, are already in widespread use. Plastic Leaded Chip Carriers (PLCC's) are another example of a well known surface mount package design. The electrical leads of these various surface mount package designs are generally of the "gull-wing" or "J-form" type. These lead configurations are well known in the art.

Most of the surface mount packages that have so far come into use have been intended for lower frequency analog operation or for complex digital IC's having large numbers of leads. While these packages are useful, they are not well adapted for use in connection with high frequency devices or IC's, that is devices operating in the range of above 25 megahertz, more particularly above about 100 megahertz and especially for operation above about 200–500 megahertz. It is not unusual to have such high frequency devices operating at frequencies as high as 25 gigahertz. Among the problems encountered in attempting to use prior art devices and/or device packages at high frequencies are, excessive lead length, significant parasitic inductance and capacitance, and excessive thermal impedance. These problems become more severe as the desired operating frequency increases.

For example, semiconductor device operation at such high frequencies generally requires very high current densities. As a result, the internal power dissipation of the device is also quite high, for example, in the range of one to three Watts or more. Unless great care is taken to provide a package configuration with low thermal impedance, junction temperatures will be high and operating life will be shortened. In addition, the lead length and impedance must be minimized, especially in the common (electric reference) leads since parasitic impedance in such leads is degenerative. For these and other reasons well known in the art, the design of devices and/or device packages for operation at such high frequencies must be different than the usual design practice in connection with lower frequency devices and/or IC's.

The device packages generally used for such high frequency range are often made from expensive materials such as ceramic, glass and/or metal, and have a multiplicity of metal layers or internal piece parts or both. For these and other reasons well known in the art most prior art high frequency packages are expensive. There is an ongoing need for improved means and methods for high frequency device packages and devices, especially packages and devices that use low cost materials and methods, that have low thermal and parasitic impedance, that are suitable for surface mounting, and that handle substantially amounts of power, i.e., $\geq 1$ Watt, especially $\geq 3$ watts.

BRIEF SUMMARY OF THE INVENTION

It is an object of the present invention to provide a means and method for improved high frequency power devices and/or packages, especially devices and packages employing low cost materials and methods, and having low thermal and parasitic impedance. It is a further object to provide these features and methods in connection with devices and/or packages suitable for surface mounting.

The foregoing and other objects and advantages are provided by an electronic device for operation at high frequencies with at least one semiconductor die, a metallic lead means for supporting the semiconductor die and making electrical connection thereto and an encapsulation surrounding the semiconductor die and part of the lead means, wherein the metallic lead means is monolithic and composed of a thin region for making external electrical connections to the device and having upper and lower faces, and a thick region with an upper face coplanar with the upper face of the thin region for supporting the semiconductor die and a lower face exposed on a lower face of the encapsulation. It is desirable that the thin region for making external electrical connection has an external portion extending from a side of the encapsulation and downwardly bent so that, at a terminal end thereof, the lower face thereof is substantially coplanar with the lower face of the thick region.

In a preferred embodiment part of the lead means is "H" shaped with the cross-bar portion of the "H" containing the thick region extending transversely from one side of the "H" to the other and with upright portions of the "H" being part of the thin region and forming common external electrical connection to the device. It is further desirable that the cross-bar comprise portions of the thin region that extend transversely from one side of the "H" to the other and separate the thick region from the upright portions. It is still further desirable that these portions of the thin region be located on opposed edges of the cross-bar of the "H".

The forgoing device is provided by a method comprising, providing a monolithic metal leadframe having a substantially planar upper surface and having a first, thinner, portion for making external electrical connections to the device and a centrally located second, thicker, portion for receiving a semiconductor element and connections thereto, bonding a semiconductor element to the upper surface of the second portion, making connections between the semiconductor element and the upper surface of the first portion on or adjacent to the central portion, encapsulating the semiconductor element and part of the leadframe so that external electrical connection portions of the first part extend from sides of the encapsulation and a lower surface of the second portion opposite the upper surface is exposed on a lower surface of the encapsulation.

It is further desirable to shear away remaining portions of the leadframe external to the encapsulation which are not part of the external electrical connections to the device or the exposed lower surface of the second portion, and down-form the portions of the leadframe forming the external electrical connections to the device so that lower surfaces of the down-formed connections are substantially coplanar with the lower surface of the second portion.

In a preferred embodiment, the providing step comprises (i) providing a multiplicity of individual monolithic leadframes in connected strip form, the individual leadframes being supported by longitudinal side-rails and, either, (ii)(a) forming the thicker and thinner regions by pressure welding a central spine along a longitudinal central axis of the strip, or (ii)(b) forming the thicker and thinner regions by skiving away metal from those parts of the strip intended to be the thinner portions while leaving a thicker spine along a longitudinal central axis of the strip to form the thicker portions. In one embodiment, portions of the central spine between individual units of the leadframes are removed so that the thicker portions are surrounded by the encapsulation except on the bottom face. In another embodiment, portions of the central spine extend beyond the encapsulation and have attachment openings provided therein.

The present invention will be more fully appreciated by considering the attached drawings and description thereof that follows.

BRIEF DESCRIPTION OF THE DRAWINGS

FIG. 1 is a plan view in simplified form of a multi-unit device leadframe according to the present invention;

FIG. 2 is a simplified end view of the leadframe of FIG. 1;

FIG. 3 is a plan view of a single unit portion of the leadframe of FIG. 1 showing additional details and FIGS. 4 and 5 show, in simplified form, side and front views of the leadframe portion of FIG. 3, respectively;

FIG. 6 shows, in simplified form, a plan view of an encapsulated device according to a first embodiment of the present invention;

FIG. 7 shows a partial end and cut-away view of the device of FIG. 6 at the location in FIG. 6;

FIG. 8 shows, in simplified form, a plan view of an encapsulated device according to a further embodiment of the present invention;

FIG. 9 shows, in simplified form, a front view of the device of FIG. 8;

FIG. 10 shows a front view of a starting metal strip suitable for making a leadframe such as is shown in FIG. 1, according to the method of the present invention;

FIG. 11 shows a side view of the same strip as in FIG. 10 in the process of being skived to remove portions of the starting metal strip so as to leave behind a thinner web with a central spine of the same thickness as the starting material;

FIG. 12 shows a side view of a starting metal strip suitable for making a leadframe such as is shown in FIG. 1, according to another embodiment of the present invention wherein a thicker central spine is attached to a thinner starting metal strip;

FIG. 13 shows a metal strip suitable for making the leadframe shown in FIG. 1, after the steps shown in FIGS. 11 or 12, but before the openings shown in the leadframe of FIG. 1 have been formed therein; and FIG. 14 shows an end view of the metal strip of FIG. 13.

DETAILED DESCRIPTION OF THE DRAWINGS

FIG. 1 is a simplified plan view of multi-unit device leadframe 10 and FIG. 2 is an end view thereof. Multi-unit device leadframe 10 has repetitive individual leadframe units 12, such as that enclosed by circle 3 shown in FIG. 1. Various holes 14 are formed in leadframe 10, e.g., by punching or etching, to define what will eventually become central die bond region 16 and leads 18, 20 (see FIGS. 3-5).

The portion of FIG. 1 enclosed within circle 3 is shown in FIGS. 3-5 in greater detail. Leadframe 10 is a monolithic metal strip composed of a number of individual leadframe units 12 tied together (temporarily) by side-rails 22 and having central spine 24 of thickness 26 and width 27 extending along the long axis of leadframe 10 with thinner regions 28, 30 along either side of thicker central spine 24. It is desirable that upper surface 36 of thin portions 28, 30 and central region 16 above spine 24 be substantially coplanar while lower surfaces 38, 40 and 54 are not. Sides 42 of central spine 24 are indicated by the dashed lines in FIGS. 1, 3 and 6. Leadframe 10 has overall thickness 44.

Referring now to FIGS. 3-5, individual unit 12 of leadframe 10 is shown somewhat enlarged. Central portion 16 of upper surface 36 above spine 24 has thereon electronic element 46, e.g., a semiconductor die such as a transistor, diode or integrated circuit (IC) or other functional device. Electronic element 46 is electrically coupled via wire bonds or other attachment means 48 to central portion 16 of upper surface 36 of individual leadframe unit 12, and by wire bonds or other attachment means 50 to lead portions 18 of upper surface 36 of individual leadframe unit 12. Means and methods for providing such wire bonds or attachment means are well known in the art.

Electronic element 46 and wire bonds 48, 50 are covered by encapsulation 52 of, for example, a plastic resin. Other encapsulation materials may also be used, but plastic resin is preferred. Lower surface 54 of central spine 24 is exposed on lower surface 56 of encapsulation 52. It is desirable to provide a die coat (not shown) over the upper surface of die 46 before providing encapsulation 52, but this is not essential. Encapsulation 52 is conveniently provided by transfer or injection molding but other methods also well known in the art will also suffice. Transfer molding is preferred.

FIG. 6 shows a plan view of device 60 formed from individual unit 12 of leadframe 10 after encapsulation and removal of side-rails 22 (see FIG. 1), and FIG. 7 shows a partial cut-away and end view of the device of FIG. 6. Mounted on a printed circuit (PC) board or the like. Die 46 is located on central portion 16 of upper surface 36 of leadframe portion 12 above longitudinal spine 24. After side-rails 22 are sheared away, individual leadframe unit 12 is "H" shaped. This is a preferred arrangement, but other lead geometries may also be used.

The lower surface of die 46 is bonded to central portion 16 above longitudinal spine 24 using means well known in the art. Soldering is preferred. Wire bonds 48 connect contact points on the upper surface of die 46 to central portion 16, which forms the cross-bar portion of the "H" extending from one side of the "H" to the other. External leads 20 form the upwardly and downwardly extending arms of the "H" and are conveniently formed as a part of thinner portions 28, 30 of leadframe portion 12. External connection arms 20 of the "H" connect to central region 16, and conveniently provide low impedance contacts to the reference connection of the electronic element.

Located between leads 20 are one or more leads 18 which are connected by wire bonds 50 to other contact pads on die 46. These conveniently form the input-output (I/O) leads of the device, but may also be used for other electrical purposes. Having common leads 20 extend along either side of I/O leads 18 reduces parasitic coupling to other devices and wires that may be located on the same PC board with device 60. Leads 18, 20 are conveniently down-formed, as shown in FIG. 7 so that lower surfaces 62 of terminal ends 64 of leads 18,20 are substantially coplanar with exposed surface 54 of central spine 24. This permits device 60 to be attached by surface mounting to contact pads 66, 68 of, for example, PC board 70. Lead ends 64 and bottom face 54 of central spine 24 are soldered to planar contact regions 66, 68 although other attachment means well known in the art may also be used.

FIGS. 3–5 and 6–7 illustrate that electronic elements or semiconductor die 46 of varying dimensions may be used in connection with unit leadframe 12, wire bonds 48, 50 and encapsulation 52. Those of skill in the art will understand based on the explanation herein how to vary the dimensions of central portion 16 of surface 36 of leadframe portion 12 to accommodated die of varying sizes.

FIGS. 8 and 9 show, respectively, a plan and front view of a further embodiment of the present invention. Device 72 is similar in construction to device 60 except that central spine 24' of FIGS. 8–9 extends beyond the ends of encapsulation 52 and has therein mounting holes 76 or other openings to facilitate attachment of device 72 to a PC board or other support. The same reference numbers are used to identify like regions in FIGS. 8–9 as in FIGS. 6–7. Leads 18, 20 are down-formed so that lower surfaces 62 of lead ends 64 are substantially coplanar with lower surface 54' of central spine 24' exposed on lower surface 56 of encapsulation 52.

Referring now to FIGS. 3, 4, 6, 7 and 8, sides 42 of thicker central spine 24, 24' lie within opposed boundaries 74 of central portion 16. This is most clearly seen in FIG. 7 which is a partial cut-away and end view taken looking along the central axis of leadframe 10, i.e., parallel to central spine 24, 24'. It is desirable that thicker central spine 24, 24' have width 27 less than width 75 between edges 74 of central region 16 so that edges 74 of central region 16 overhang (see FIG. 7) sides 42 of central spine 24 by amount 78. It is convenient that overlap amount 78 be approximately equal along both edges of central region 16. The presence of overhang amount 78 facilitates the forming and handling of leadframe 10 and is a particular feature of the present invention. Further, it provides a convenient "lock" for retaining encapsulation 52 around die 46, central spine 24, 24' and the interior ends of leads 18, 20.

It is important that leadframe 10 be homogeneous, that is, formed of the same material, rather than of several different materials or several different pieces of the same material coupled only at small spots or the like. This reduces differential thermal expansion problems and joints or interfaces that might adversely affect the electrical and/or thermal impedance. The manner in which this is accomplished is illustrated in connection with FIGS. 10–14.

FIG. 10 shows an edge view of starting metal strip 80 having opposed surfaces 82, 84 and thickness 32 or 44 (See FIG. 1), and from which a leadframe similar to leadframe 10 of FIG. 1 is intended to be fabricated. OFHC copper is the preferred starting material but other leadframe materials well known in the art may also be used. In a preferred embodiment, metal strip 80 has thickness 44 and is skived as indicated in FIG. 11 to reduce the thickness of metal remaining (see FIGS. 1–2) in regions 28, 30 while leaving the region forming central spine 24 intact. the result is shown in FIGS. 13–14. Skiving is the continuous shaving or splitting of a metal strip to reduce its thickness.

Referring now to FIG. 11, metal strip 80 having thickness 44 i.e., corresponding to desired thickness 44 of leadframe 10, is pushed and pulled in direction 88 by rolls 90 against skiving knife 92 having sharp wedge point 94. Skiving knife 92 is shown in cross-section in FIG. 11 and has two spaced apart portions 92, 92', shown as dashed lines in FIG. 13, with a gap in between equal to desired width 27 (see FIGS. 4, 13) of central spine 24. Central spine 24 of FIGS. 10–11, 13–14 corresponds to central spine 24 of FIGS. 1–2. Surface 82 of FIGS. 10–11, 13–14 corresponds to surface 54 and surface 84 corresponds to surface 36 of FIGS. 1–2. Skiving has the advantage that a leadframe having different regions of precisely controlled thicknesses and width may be formed in a single, inexpensive operation. Skiving is possible with the invented arrangement because thicker region 96, 24 is in the form of a spine running longitudinally down the length of metal strip 80. Once starting metal strip 80 has been skived to provide selectively thinned metal strip 80' shown in FIGS. 13–14, holes 14 (see FIG. 1) are punched or etched in strip 80' to give leadframe 10 or the like. While it is preferred to skive out spine 24 first and punch or etch holes 14 second, the order may be inverted, but this is less desirable.

Referring now to FIG. 12, starting metal strip having thickness 32 corresponding to thickness 32 of thinner portions 28, 30 of leadframe 10 in FIG. 1, is push-pulled in direction 102 through rolls 104 where narrow strip 106 of width 27 and thickness 26, and desirably of the same metal as starting strip 80, is pressure and heat welded to strip 80 by rolls 104. Resulting metal strip 108 is substantially homogeneous since the two portions are joined without solder or intervening foreign material. Strip 108 with welded-on central spine 106, equivalent to spine 24 has the appearance of FIGS. 13–14 and is suitable for fabricating leadframe 10 in the same manner as for strip 80'. While it is preferred to attach strip 108 first and punch or etch holes 14 second, the order may be inverted, but this is less desirable.

Once spine 24 has been formed and metal strip 80', 108 has been punched or etched to have openings 14 or the like therein (see FIG. 1), then die 46 is mounted on central portion 16, wire bonds or other coupling means 48, 50 provided and the leadframe inserted in a mold press for providing encapsulation 52 surrounding chip 46 and wires 48, 50, but leaving bottom 54, 54' of central spine 24, 24' exposed.

Side-rails 22 are clipped off so that leads 18, 20 are separated therefrom and from each other. In the same or a subsequent operation leads 18, 20 are desirably down-formed to have the configuration suitable for surface mounting illustrated in FIGS. 6–9 suitable for surface mounting.

In a typical eight lead, "H" form device such as is illustrated in FIGS. 1–9, the thickness of portions 28, 30 of the leadframe, i.e., dimension 32 in FIG. 2, is usefully in the range of 0.1–0.3 mm, with 0.15–0.25 mm being more convenient and about 0.2 mm being preferred. Central spine has a thickness 26 in the range of about 0.5–2.5 mm with about 1–2 mm being more convenient and about 1.5 mm being preferred, and central spine 24 has a width 27 in the range of about 0.5–2.5 mm with about 1-2 mm being more convenient and about 1.3 mm being typical. Width 74 of die mount portion 16 (see FIG. 7) is about 0.1-0.3 mm wider than central spine 24 with about 0.25 mm being typical. Thus, overhang amounts 78 between side 42 of spine 24 and edge 74 of die bond region 16 are about half that, i.e., about 0.13 mm. Leads 18, 20 are generally the same thickness as thickness 32 (see FIG. 2) of the thinner portion leadframe 10. Leads 18 are generally about 0.25-0.51 mm wide with about 0.41 mm being typical and leads 20 are generally about twice this width. The spacing between the leads is generally about 0.25-0.76 mm with about 0.51 mm being typical. The lead length, i.e., the distance by which they extend away from the sides of package body 52 is determined by the configuration into which they are intended to be formed.

Where the leads are left flat, i.e., protruding straight away from encapsulation 52 without bends, then they can be quite short, i.e., 1-3 mm in length. In this situation, the protruding leads generally mount directly on contact pads on the PC board while adjacent exposed spine 24 protrudes through the PC board to an underlying heat sink.

Where the leads are down-formed either into a "gull-wing" or "J-form" arrangement they typically are slightly longer to provide for the multiple bends required and the additional distance from the plane of die bond region 16 to the plane of exposed lower face 54 of spine 24. FIG. 7 illustrates a "gull-wing" arrangement. However, protruding leads 18, 20 can also be formed into the familiar "J" arrangement wherein the lower end of each lead is bent back toward or into a small recess in the lower face of encapsulation 52. In either case (i.e., "gull-wing" or "J-form") it is desirable that lead ends 64 which are intended to contact PC board mounting pads 66 have their lower surfaces substantially coplanar with lower surface 54 of spine 24.

It will be apparent based on the foregoing description that the invented means and method provide an improved high frequency power device and/or package, especially a device and/or package employing low cost materials and methods, and having low thermal and parasitic impedance. It further provides these features and methods in connection with devices and/or packages suitable for surface mounting.

The arrangement provides very short leads between the die inside the package and the external PC board to which the device is ultimately connected. These short distances reduce parasitic inductance, capacitance and feedback. This provides improved high frequency performance for the same operating conditions.

Another virtue of the present invention is that die 46 is bonded to homogeneous thicker metal region 16, 24 having its lower face 54 exposed outside encapsulation 52 for efficient spreading and extraction of heat. This allows the package and device to have particularly low thermal impedance so that the maximum RF performance for a given power dissipation can be realized.

A further virtue of the present invention is the provision of "H" shaped common or electrical reference leads 20 which shield active leads 18, desirably located between the arms of the "H", from parasitic feedback and coupling to other portions of the circuit. This further improves electrical performance.

A still further advantage of the present invention is that the device is constructed using a minimum number of piece parts, i.e., the active die, a section of one-part leadframe, the wire bonds and the encapsulation. The one-part leadframe is comparatively inexpensive. For example, the cost of skiving or swaging the starting metal strip to produce the configuration shown in FIGS. 13-14 and in FIGS. 1-2, is small on a per-unit basis, as compared to the cost of manufacture and assembly using the ceramic boards, thin film boards, or multi-part leadframes of the prior art.

In addition, the invented leadframe configuration has a substantially planar upper surface 36. This greatly facilitates die bonding and wire bonding and the like. Further, the homogeneous one-piece skived or continuously welded leadframe is much easier to handle than multi-part leadframes and/or subassemblies mounted on ceramic boards or other complex substrates. Thus, the invented means and method is particularly well suited to automated manufacture.

It will be apparent based on the foregoing description that the invented means and method provides an improved high frequency power device and/or package, especially a device and/or device package employing low cost materials and methods, and having low thermal and parasitic impedance. It further provides these features and methods in connection with devices and/or packages suitable for surface mounting.

While the present invention has been illustrated in terms of particular embodiments, the principles apply to a wide variety of variations. For example, and not intended to be limiting, while spine 24 is shown as being centrally located with regions 28, 30 of approximately equal width and/or leads 18, 20 forming the arms of the "H" having approximately equal length, this is not essential and longitudinal spine 24 may be off center in leadframe 10 so long as overhang amount 78 is still provided. Further while it is preferred to form central spine 24 before punching or etching the various openings in strip 80, 108 to form the multiple connected leadframes, this is not essential. Central spine 24 may be formed after the various openings or holes have been formed in the remainder of the strip. In the latter case, those portions of central spine 24 not intended to be part of the finished device are sheared away at the same time as the side rails.

Having thus described the invention, those of skill in the art will understand that it is not intended to be limited to the particular embodiments described, but to apply to all embodiments that fall within the ambit of the attached claims.

We claim:

1. An electronic device for operation at high frequencies and containing at least one semiconductor die, a metallic leadframe supporting the semiconductor die and making electrical connection thereto and an encapsulation surrounding the semiconductor die and part of the leadframe, the metallic leadframe being monolithic and composed of a thin region for making external electrical connections to the device and having upper and lower faces, and a thick region with an upper face coplanar with the upper face of the thin region having the semiconductor die mounted thereon and a lower face exposed on a lower face of the encapsulation, and part of the metallic leadframe being formed in the shape of an "H" with a cross-bar portion of the "H" containing the thick region extending transversely from one side of the "H" to the other and arms of the "H" being part of the thin region and forming common external electric connections to the device.

2. The device of claim 1 wherein the thin region for making external electrical connection has an external portion extending from a side of the encapsulation and downwardly bent so that, at a terminal end thereof, a lower face of the terminal end is substantially coplanar with the lower face of the thick region.

3. The device of claim 1 wherein part of the leadframe is formed in the shape of an "H" with a cross-bar portion and with arm portions extending above and below the cross-bar portion, wherein the arm portions are part of the thin region and form a common electrical connection to the semiconductor die, wherein the thick region supporting the semiconductor die is centrally located in the cross-bar portion and extends transversely from one side of the "H" to the other, and wherein the cross-bar portion further comprises portions of the thin region which extend transversely from one side of the "H" to the other and separate the thick region from the arm portions.

4. The device of claim 3 wherein the portions of the thin region which extend transversely from one side of the "H" to the other and separate the thick region from the arm portions are located at opposed edges of the cross-bar portion of the "H".

5. A high frequency electronic device comprising:
an "H" shaped monolithic metallic leadframe for supporting a semiconductor element and providing external electrical and thermal contact thereto;
at least one semiconductor element bonded to a central portion of the monolithic metallic leadframe;
encapsulation at least partially enclosing the central portion of the monolithic leadframe; and
wherein the central portion of the monolithic leadframe has two thicknesses, a first thickness in those parts of the central portion which connect with exterior portions of the leadframe extending beyond the encapsulation to form external electrical leads, and a second, larger, thickness in a part located beneath the semiconductor element bonded to a first surface thereof and which has a second, opposed, surface exposed on a surface of the encapsulation to provide thermal connection to the device, wherein the part of the central portion having the second thickness is bordered on sides facing the external electrical leads by a region of the parts of the central portion having the first thickness.

6. A high frequency semiconductor device comprising, a semiconductor die, a monolithic metal leadframe formed generally in the shape of an "H" pattern with a crossbar having a thick portion with the semiconductor die mounted thereon and thinner portions comprising electrical leads for making external electrical connection to the device and an encapsulation surrounding the semiconductor die and part of the leadframe, wherein the thinner portions comprise (i) multiple leads arranged in the form of arms of the "H" pattern extending two from each of two opposed sides of the encapsulation and forming a common electrical connection to the semiconductor die located over the thick portion and (ii) at least one additional lead located between two of the arms of the "H" pattern for making a further electrical connection to the semiconductor die, wherein a lower face of the thick portion located in the cross-bar of the "H" pattern opposite the die is exposed on a bottom surface of the encapsulation.

7. The device of claim 6, wherein the part of the leadframe surrounded by the encapsulation has a coplanar upper surface.

8. The device of claim 6 wherein the thick portion is bordered on opposed sides facing the arms of the "H" pattern by a further part of the thinner portions.

* * * * *